(12) United States Patent
Hayashi

(10) Patent No.: US 9,647,599 B2
(45) Date of Patent: May 9, 2017

(54) ELECTRONIC APPARATUS

(71) Applicant: DENSO CORPORATION, Kariya, Aichi-pref. (JP)

(72) Inventor: Jirou Hayashi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/957,379

(22) Filed: Dec. 2, 2015

(65) Prior Publication Data

US 2016/0164278 A1    Jun. 9, 2016

(30) Foreign Application Priority Data

Dec. 4, 2014   (JP) ................. 2014-245828

(51) Int. Cl.
| | |
|---|---|
| H02P 1/00 | (2006.01) |
| H02P 27/06 | (2006.01) |
| B62D 5/04 | (2006.01) |
| H02P 29/024 | (2016.01) |
| G01R 31/42 | (2006.01) |
| G01R 31/02 | (2006.01) |
| H02H 7/122 | (2006.01) |
| G01R 31/34 | (2006.01) |
| G01R 31/00 | (2006.01) |
| H02P 25/22 | (2006.01) |

(52) U.S. Cl.
CPC ............ *H02P 27/06* (2013.01); *B62D 5/0457* (2013.01); *G01R 31/025* (2013.01); *G01R 31/42* (2013.01); *H02P 29/024* (2013.01); *G01R 31/007* (2013.01); *G01R 31/343* (2013.01); *H02H 7/1227* (2013.01); *H02P 25/22* (2013.01)

(58) Field of Classification Search
CPC ........ B62D 5/0457; G01R 31/02; H02H 9/02; H02P 27/06
See application file for complete search history.

(56) References Cited

U.S. PATENT DOCUMENTS

| | | |
|---|---|---|
| 2013/0207586 A1 | 8/2013 | Hayashi |
| 2016/0118923 A1* | 4/2016 | Kano ..................... H02P 25/22 318/400.02 |

* cited by examiner

*Primary Examiner* — Karen Masih
(74) *Attorney, Agent, or Firm* — Knobbe, Martens, Olson & Bear, LLP

(57) ABSTRACT

An electronic apparatus includes a rotating electric machine that has a plurality of multi-phase winding sets, each of which has a plurality of phase windings; a plurality of inverter circuits that are connected to the plurality of multi-phase winding sets respectively; and a control circuit that controls the plurality of inverter circuits such that a multi-phase alternating current is supplied to each of the plurality of multi-phase winding sets from each of the plurality of inverter circuits. The control circuit determines that a short circuit occurs when i) a plurality of phase current added values obtained by adding each phase current flowing through each of the plurality of phase windings calculated at each of the plurality of multi-phase winding sets; and ii) an absolute value of a total phase current added value obtained by adding all of the plurality of phase current added values is smaller than a predetermined value.

5 Claims, 3 Drawing Sheets

ELECTRONIC APPARATUS

CROSS REFERENCE TO RELATED APPLICATIONS

This application is based on Japanese Patent Application No. 2014-245828 filed on Dec. 4, 2014, the disclosure of which is incorporated herein by reference.

TECHNICAL FIELD

The present disclosure relates to an electronic apparatus that includes: a rotating electric machine having a plurality of multi-phase winding sets; and a plurality of inverter circuits arranged for the plurality of multi-phase winding sets respectively and connected to the plurality of multi-phase winding sets respectively.

BACKGROUND

An electric power steering apparatus disclosed in, for example, Patent Document 1 described below has been configured as an electronic apparatus that includes: a rotating electrical machine having a plurality of multi-phase winding sets; and a plurality of inverter circuits arranged for the plurality of multi-phase winding sets respectively and connected to the plurality of multi-phase winding sets respectively.

The electric power steering apparatus includes: a motor; a first inverter unit and a second inverter unit; and a control unit. The motor includes a first winding assembly and a second winding assembly. The first winding assembly and the second winding assembly are respectively configured by connecting three windings in a star shape. The first inverter unit is connected to the first winding assembly, and the second inverter unit is connected to the second winding assembly. The control unit is connected to the first inverter unit and the second converter unit. The motor corresponds to the rotating electrical machine; the first winding assembly and the second winding assembly correspond to the multi-phase winding; and the first inverter unit and the second inverter unit correspond to the inverter circuit.

The control unit controls the first inverter unit and the second inverter unit so that three-phase currents are supplied to the first winding assembly and the second winding assembly from the first inverter unit and the second inverter unit. Therefore, the motor generates a torque that assists in steering. In addition, the control unit detects a fault. The control unit evaluates a phase current added value that adds each phase current to each of the winding assemblies, and determines a short circuit occurs between the part where the first inverter unit and the first winding assembly are arranged and the part where the second inverter unit and the second winding assembly are arranged when the difference of the phase current added values with regard to the first winding assembly and the second winding assembly is out of a predetermined range.

The electric power steering apparatus mentioned above determines whether a short circuit occurs based on the difference of the phase current added value of the first winding assembly and the phase current added value of the second winding assembly. Accordingly, it is possible to detect a short circuit also when a ground fault occurs. In other words, it is difficult to detect a short circuit in distinction from a ground fault.

[Patent Document 1] Japanese Unexamined Patent Application Publication No. 2013-165541

SUMMARY

It is an object of the present disclosure to provide an electronic apparatus that surely detects a short circuit in distinction from a ground fault.

An electronic apparatus according to one aspect of the present disclosure includes: a rotating electric machine that has a plurality of multi-phase winding sets, each of which having a plurality of phase windings; a plurality of inverter circuits that are arranged for the plurality of multi-phase winding sets respectively, and are connected to the plurality of multi-phase winding sets respectively; and a control circuit that is connected to the plurality of inverter circuits, and controls the plurality of inverter circuits such that a multi-phase alternating current is supplied to each of the plurality of multi-phase winding sets from each of the plurality of inverter circuits. The control circuit determines that a short circuit occurs when i) a plurality of phase current added values obtained by summing up each phase current flowing through each of the plurality of phase windings calculated at each of the plurality of multi-phase winding sets; and ii) an absolute value of a total phase current added value obtained by adding all of the plurality of phase current added values is smaller than a predetermined value.

According to the electronic apparatus mentioned above, the control circuit uses the above-mentioned properties to determine the occurrence of a short circuit when i) a plurality of phase current added values calculated at each of the plurality of phase windings are out of a predetermined range; and ii) the absolute value of the total phase current added value is smaller than the predetermined value. Accordingly, the short circuit can be surely detected in distinction from the ground fault.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The following describes an embodiment with regard to the present disclosure in detail.

First Embodiment

Figure 1:
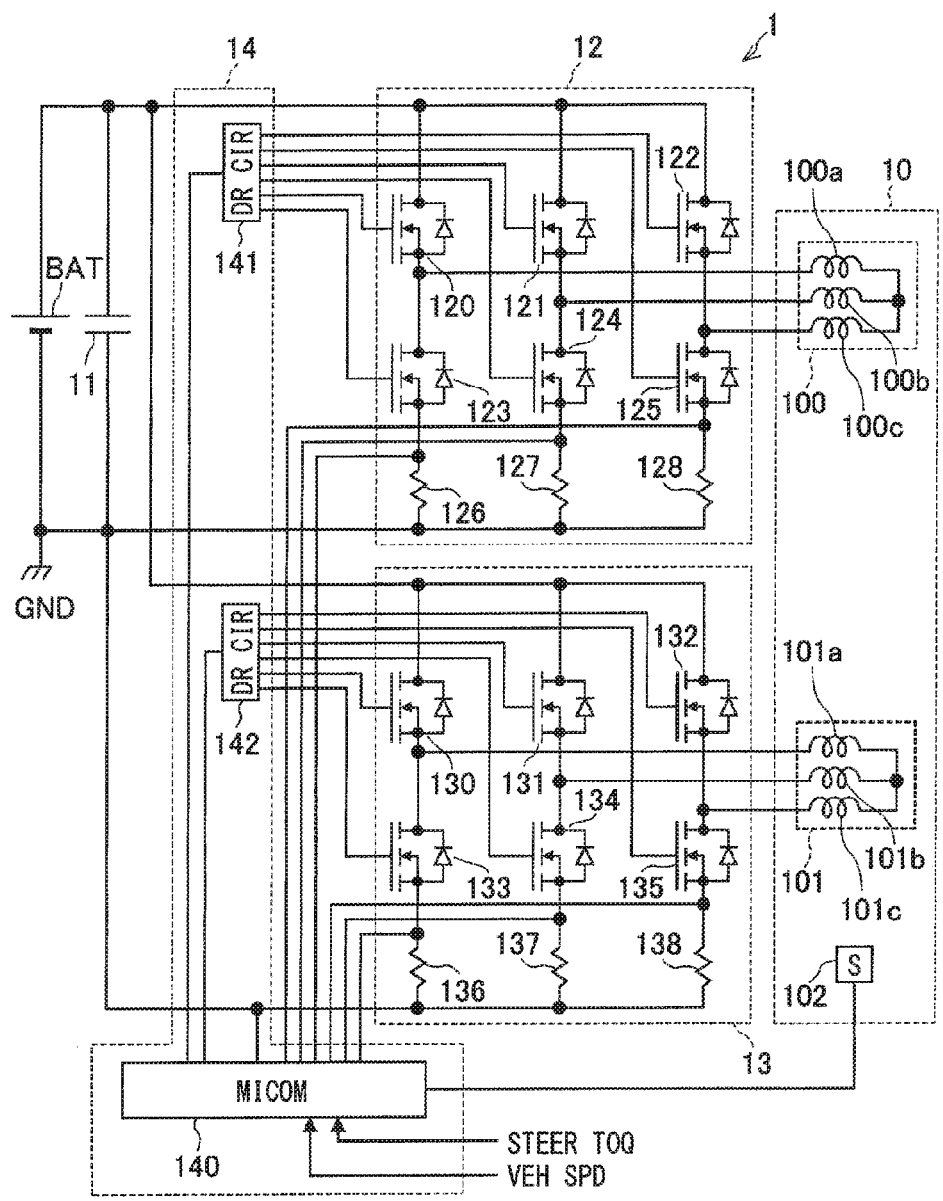
FIG. 1 is a circuit diagram of an electric power steering apparatus according to a first embodiment.

First, the following describes the configuration of an electric power steering apparatus according to a first embodiment with reference to FIG. 1.

The electric power steering apparatus 1 (corresponding to an electronic apparatus) illustrated in FIG. 1 is mounted to a vehicle and assisted in steering of a steering wheel. The electric power steering apparatus 1 includes a motor 10

(corresponding to a rotating electric machine), a capacitor 11, inverter circuits 12 and 13, and a control circuit 14.

The motor 10 is a machine that generates a torque for assisting in steering of the steering wheel. The motor 10 includes three-phase winding set 100, 101 (corresponding to a multi-phase winding) and a rotational angle sensor 102.

The three-phase winding sets 100, 101 are members that generate a rotational magnetic field for rotating a rotor (not illustrated) through the flow of a three-phase alternating current (corresponding to a multi-phase alternating current). The three-phase winding set 101 is configured by connecting a U-phase winding 101a, a V-phase winding 101b and a W-phase winding 101c in a star shape. The three-phase winding sets 100, 101 are arranged for the same stator (not illustrated). The three-phase winding set 100 is connected to the inverter circuit 12; and the three-phase winding set 101 is connected to the inverter circuit 13.

The rotational angle sensor 102 detects the rotational angle of the rotor required for controlling the phases of three-phase alternating currents supplied to the three-phase winding set 100 and the three-phase winding set 101. The rotational angle sensor 102 is connected to the control circuit 14.

The capacitor 11 is an element for smoothing a direct current supplied from a battery BAT and supplying the direct current to the inverter circuits 12, 13. The capacitor has: one end that is connected to the positive terminal side of the battery BAT; and another end that is connected to the negative terminal side of the battery BAT. The negative terminal end of the battery BAT is grounded to a ground GND as a reference point of a potential. In particular, the negative terminal end of the battery BAT is connected to a vehicular body.

The inverter circuit 12 includes FETs 120 through 125 and resistors 126 through 128.

The FETs 120 through 125 are elements that convert a direct current supplied through the capacitor 11 to a three-phase current. The FETs 120, 123, the FETs 121, 124 and FETs 122, 125 are connected in series respectively. In particular, the sources of the FETs 120 through 122 are connected to the drains of the FETs 123 through 125 respectively. The FETs 120, 124, which are connected in series, the FETs 121, 123, which are connected in series, and the FETs 122, 125, which are connected in series, are connected in parallel. The drains of the FETs 120 through 122 are connected to one end of the capacitor 11; and the sources of the FETs 123 through 125 are connected to the other end of the capacitor 11 through the resistors 126 through 128. The gates of the FETs 120 through 125 are connected to the control circuit 14. The connection point of the series connection of the FETs 120, 123, the connection point of the series connection of the FETs 121, 124 and the connection point of the series connection of the FETs 122, 125 are connected to the U-phase winding 100a, the V-phase winding 100b and the W-phase winding 100c respectively.

The resistors 126 through 128 are elements that detect phase currents Iu1, Iv1 and Iw1 flowing through the U-phase winding 100a, the V-phase winding 100b and the W-phase winding 100c respectively. The resistors 126 through 128 have: one ends that connect to the sources of the FETs 123 through 125; and another ends that connect to the other end of the capacitor 11.

The inverter circuit 13 converts a direct current supplied through the capacitor 11 to a three-phase current and then supply the three-phase current to the three-phase winding set 101. The inverter circuit 13 includes the FETs 130 through 135 and the resistors 136 through 138.

The FETs 130 through 135 are elements that convert a direct current to a three-phase current through switching, and have the configuration identical to the FETs 120 through 125.

The resistors 136 through 138 are elements that detect phase currents Iu2, Iv2 and Iw2 flowing through the U-phase winding 101a, the V-phase winding 101b and the W-phase winding 101c, and have the configuration identical to the resistors 126 through 128.

The control circuit 14 controls the inverter circuits 12 and 13 based on based on i) the detection result of a steering torque and a vehicle speed inputted from outside; ii) the detection result of the rotational angle of a rotor inputted from the rotational angle sensor 102; and iii) the detection results of the phase currents Iu1, Iv1 and Iw1 flowing through the three-phase winding set 100 inputted from the resistors 126 through 128 and the phase currents Iu2, Iv2 and Iw2 flowing through the three-phase winding set 101 inputted from the resistors 136 through 138. In particular, the control circuit 14 controls the inverter circuits 12 and 13 such that the three-phase alternating currents required for generating an auxiliary torque are respectively supplied to the three-phase winding sets 100 and 101 respectively from the inverter circuits 12 and 13. In addition, the control circuit 14 detects a short circuit, which occurs between the set of the inverter circuit 12 and the three-phase winding set 100 and the set of the inverter circuit 13 and the three-phase winding set 101, in distinction from a ground fault based on the detection results of the phase currents Iu1, Iv1 and Iw1 flowing through the three-phase winding set 100 inputted from the resistors 126 through 128 and the phase currents Iu2, Iv2 and Iw2 flowing through the three-phase winding set 101 inputted from the resistors 136 through 138.

The control circuit 14 controls the inverter circuits 12 and 13 so that the three-phase alternating currents are supplied to the three-phase winding sets 100 and 101 from the inverter circuits 12 and 13 respectively. Accordingly, when a short circuit or a ground fault does not occur, both values of the phase current added value A1 (=Iu1+Iv1+Iw1) obtained by adding the phase currents Iu1, Iv1, Iw1 flowing through the three-phase winding set 100 and the phase current added value A2 (=Iu2+Iv2+Iw2) obtained by adding the phase currents Iu2, Iv2, Iw2 flowing through the three-phase winding set 101 become zero. Accordingly, the absolute value B (=|A1+A2|) of the total phase current added value obtained by adding the phase current added values A1 and A2 also becomes zero.

When a short circuit occurs between the part where the inverter circuit 12 and the three-phase winding set 100 are arranged and the part where the inverter circuit 13 and the three-phase winding set 101 are arranged, a current flows through the part between the three-phase winding set 100 and the three-phase winding set 101. For example, when a short circuit occurs between the three-phase winding sets 100 and 101 and a current flows from the three-phase winding set 100 to the three-phase winding set 101, in a case where the current flowing into the three-phase winding set is designated as a positive sign and the current flowing out from the three-phase winding set is designated as a negative sign, the phase current added value A1 of the three-phase current is decreased, whereas the phase current added value A2 is increased by the decreasing amount in the phase current added value A1. When the three-phase alternating currents supplied to the three-phase winding sets 100 and 101 from the inverter circuits 12 and 13 respectively increase with the elapse of time, the current flowing into the three-phase winding set 101 from the three-phase winding set 100 also is increased. Accordingly, the phase current added value A1 of the three-phase winding set 100 is further decreased, and the phase current added value A2 of the three-phase winding set 101 is increased by the amount of decreasing in the phase current added value A1. In other words, the phase current added value A1 of the three-phase winding set 100 and the phase current added value A2 of the three-phase winding set 101 are zero when a short circuit does not occur; however, both values increase or decrease when a short circuit occurs.

When at least one of the inverter circuits 12 and 13 and the three-phase winding sets 100 and 101 is grounded, a current flows between the three-phase winding connected to the inverter circuit being grounded and the ground GND or between the three-phase winding set being grounded and the ground GND. Accordingly, the total phase current added value changes in an amount of the current flowing between the three-phase winding set and the ground GND. Accordingly, the absolute value B of the total phase current added value is increased. In other words, the absolute value B of the total phase current added value is zero in a case where a ground fault does not occur; however, the absolute value B is increased when a ground fault occurs. The control circuit 14 detects a short circuit in distinction from a ground fault with the use of the above-mentioned properties.

The control circuit 14 includes a microcomputer 140 and driving circuits 141 and 142.

The microcomputer 140 generates and outputs driving signals to the inverter circuits 12 and 13 such that the three-phase alternating currents required for generating an auxiliary torque are supplied to the three-phase winding sets 100 and 101 from the inverter circuits 12 and 13 based on based on: i) the detection result of a steering torque and a vehicle speed inputted from outside; ii) the detection result of the rotational angle of a rotor inputted from the rotational angle sensor 102; and iii) the detection results of the phase currents Iu1, Iv1 and Iw1 flowing through the three-phase winding set 100 inputted from the resistors 126 through 128 and the phase currents Iu2, Iv2 and Iw2 flowing through the three-phase winding set 101 inputted from the resistors 136 through 138. In addition, the microcomputer 140 detects a short circuit occurred between the part where the inverter circuit 12 and the three-phase winding set 100 are arranged and the part where the inverter circuit 13 and the three-phase winding set 101 are arranged based on the detection results of the phase currents Iu1, Iv1 and Iw1 flowing through the three-phase winding set 100 inputted from the resistors 126 through 128 and the phase currents Iu2, Iv2 and Iw2 flowing through the three-phase winding set 101 inputted from the resistors 136 through 138.

The microcomputer 140 evaluates an auxiliary torque to be required based on a steering torque and a vehicle speed, and generates and outputs driving signals to the inverter circuits 12 and 13 such that the three-phase alternating currents required for generating an auxiliary torque are respectively supplied to the three-phase winding sets 100 and 101 from the inverter circuits 12 and 13 based on the rotational angle of a rotor, the phase currents Iu1, Iv1, and Iw1 of the three-phase winding set 100 and the phase currents Iu2, Iv2 and Iw2 of the three-phase winding set 101. In this situation, the microcomputer 140 generates and outputs driving signals such that the three-phase alternating currents supplied to the three-phase winding sets 100 and 101 from the inverter circuits 12 and 13 do not exceed a predetermined maximum current limiting value. The maximum current limiting value defines the maximum value of the three-phase alternating current.

The microcomputer 140 determines that a short circuit occurs in a case where the phase current added values A1 and A2, which are obtained by adding each of the phase currents flowing into the three-phase winding sets 100 and 101 calculated from the phase currents Iu1, Iv1 and Iw1 of the three-phase winding set 100 and the phase currents Iu2, Iv2 and Iw2 of the three-phase winding set 101 at each of the three-phase windings, are out of a determined range (i.e., from Ad to Au) to be defined at a predetermined minimum value Ad and a predetermined maximum value Au; and in a case where the absolute value B of the total phase current added value, which is obtained by adding all the phase current added values A1 and A2 calculated at each of the three-phase winding sets, is smaller than a determination threshold value Bth. When it is determined that a short circuit occurs, the magnitude of the three-phase alternating currents supplied to the three-phase winding sets 100 and 101 from the inverter circuits 12 and 13 is limited by minimizing the maximum current limiting value. As mentioned above, when a short circuit or a ground fault does not occur, the phase current added values A1 and A2 and the absolute value B of the total phase current added value become zero. However, the values change due to, for example, variation in the property of an electronic component for constituting a circuit or a control period. The minimum value Ad and the maximum value Au of the determination range (i.e., from Ad to Au) are set at the allowable minimum and maximum values for the phase current added values A1 and A2 when a short circuit or a ground fault does not occur in view of the influence such as the variation in the properties of an electronic component for constituting a circuit or a control period. The determination threshold Bth is set at the allowable minimum and maximum values for the absolute value B of the total phase current added value when a short circuit or a ground fault does not occur in view of the influence such as the variation in the properties of an electronic component for constituting a circuit or a control period.

The microcomputer 140 is connected to an information transmission source of the steering torque and the vehicle speed. In addition, the microcomputer 140 is connected to the rotational angle sensor 102, each of the resistors 126 through 128 and each of the resistors 136 through 138. Moreover, the microcomputer 140 is connected to each of the driving circuits 141 and 142.

The driving circuits 141 and 142 switch FETs 120 through 125 and FETs 130 through 135 based on the driving signals inputted from the microcomputer 140. The driving circuit 141 is connected to the microcomputer 140 and is connected to each of the gates of the FETs 120 through 125. The driving circuit 142 is connected to the microcomputer 140 and is connected to each of the gates of the FETs 130 through 135.

The following describes the operation of the electric power steering apparatus according to the first embodiment in an ordinary state with reference to FIG. 1.

The microcomputer 140 shown in FIG. 1 evaluates an auxiliary torque required based on the steering torque and vehicle speed. The microcomputer 140 then generates and outputs driving signals such that the three-phase alternating currents for generating an auxiliary torque are respectively supplied to the three-phase winding sets 100 and 101 from the inverter circuits 12 and 13 based on the rotational angle of the rotor, the phase currents Iu1, Iv1 and Iw1 of the three-phase winding set 100 and the phase currents Iu2, Iv2 and Iw2 of the three-phase winding set 101. In this situation, the microcomputer 140 generates and outputs the driving signals such that the three-phase alternating currents supplied to the three-phase winding sets 100, 101 from the inverter circuits 12 and 13 do not exceed the predetermined maximum current limiting value.

When the microcomputer 140 inputs driving signals, the driving circuits 141 and 142 switch the FETs 120 through 125 and the FETs 130 through 135 based on the driving signals. When the FETs 120 through 125 and the FETs 130 through 135 perform switching, the inverter circuits 12 and 13 convert the direct currents supplied through the capacitor 11 to the three-phase alternating currents and then supply to the three-phase winding sets 100 and 101. When the three-phase currents are supplied, the three-phase currents flow into the three-phase winding sets 100 and 101. The three-phase winding sets 100 and 101 generate a rotational magnetic field for rotating the rotor. As a result, the motor 10 generates an auxiliary torque and assists in steering the steering wheel.

Figure 2:
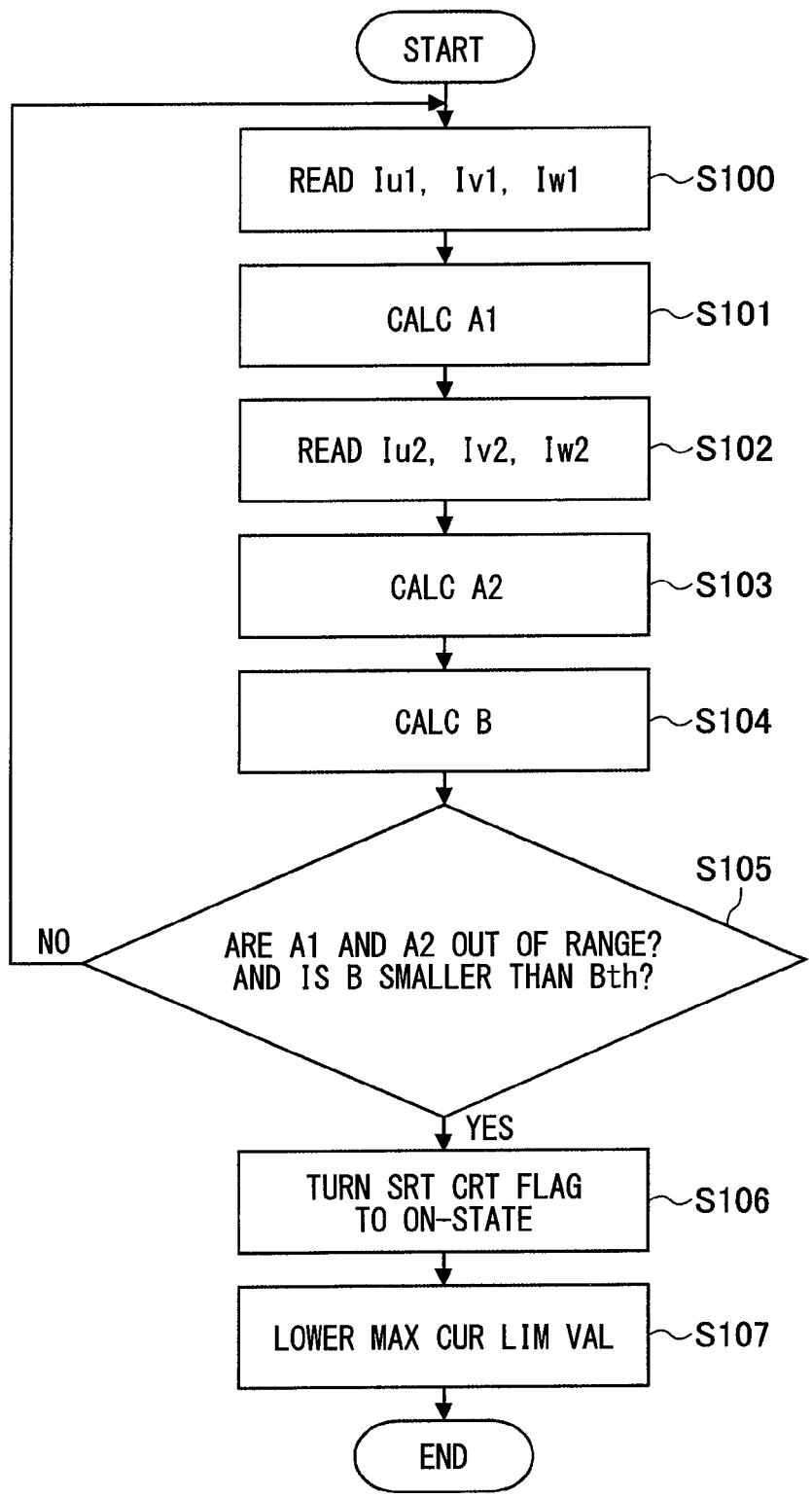
FIG. 2 is a flowchart that describes a short circuit detecting operation for the electric power steering apparatus according to the first embodiment.
Figure 3:
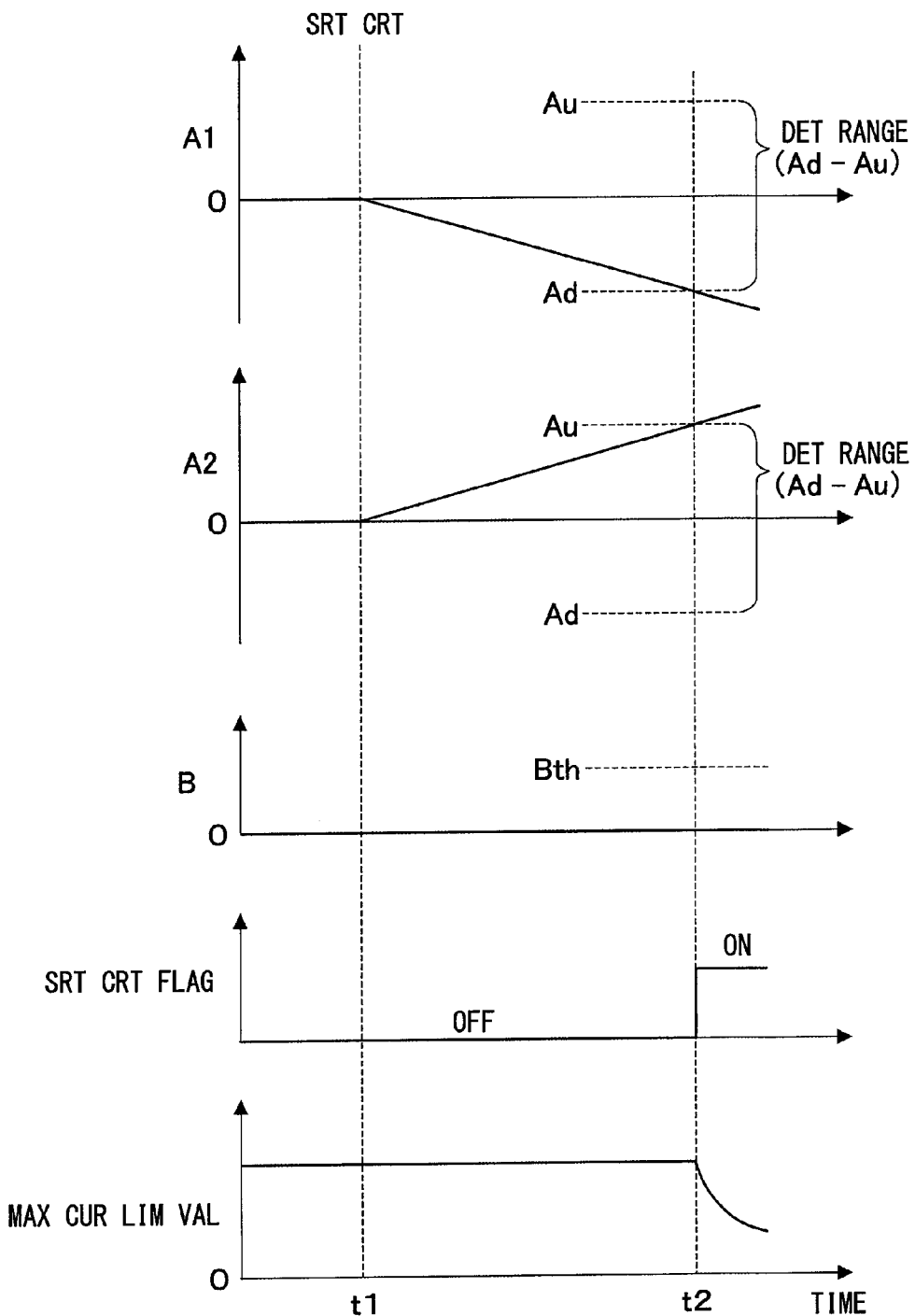
FIG. 3 is a time chart that describes the short circuit detecting operation for the electric power steering apparatus according to the first embodiment.

The following describes the operation of detecting a short circuit in the electric power steering apparatus according to the first embodiment with reference to FIGS. 2 and 3.

The microcomputer 140 reads the phase currents Iu1, Iv1 and Iw1 flowing into the three-phase winding set 100, as shown in FIG. 2, based on the detection results from the resistors 126 through 128 (at S100). The microcomputer 140 then evaluates the phase current added value A1 of the three-phase winding set 100 obtained by adding the phase currents Iu1, Iv1 and Iw1 which are read by the microcomputer 140 (at S101).

Subsequently, the microcomputer 140 reads the phase currents Iu2, Iv2 and Iw2 flowing into the three-phase windings based on the detection results from the resistors 136 through 138 (at S102). The microcomputer 140 then evaluates the phase current added value A2 of the three-phase winding set 101 obtained by adding the phase currents Iu2, Iv2 and Iw2 that are read out by the microcomputer 140 (at S103).

Subsequently, the microcomputer 140 evaluates the absolute value B of the total phase current added value obtained by adding the phase current added values A1 and A2 calculated at each of the three-phase winding sets (at S104).

The microcomputer 140 then determines: i) whether the phase current added values A1 and A2 are out of the determination range (i.e., from Au to Ad); and ii) whether the absolute value B of the total phase current added value is smaller than the determination threshold value Bth.

In step S105, when it is determined that: i) the phase current added values A1 and A2 are out of the determination range (i.e., from Au to Ad); and ii) the absolute value B of the total phase current added value is smaller than the determination threshold value Bth, the microcomputer 140 determines that a ground fault does not occur and only a short circuit occurs between the part where the inverter circuit 12 and the three-phase winding set 100 are arranged and the part where the inverter circuit 13 and the three-phase winding set 101 are arranged, then a short circuit flag is in an on state (at S106). Subsequently, the maximum current limiting value is configured to be smaller than the one at a previous time (at S107), and then the short circuit detection process is terminated.

On the other hand, in Step S105, when it is not determined that: i) the phase current added values A1 and A2 are out of the predetermination range (i.e., from Au to Ad); and ii) the absolute value B of the total phase current added value is smaller than the determination threshold value Bth, the microcomputer 140 determines that at least a short circuit does not occur and then returns the process to Step S100.

The control circuit 14 controls the inverter circuits 12 and 13 such that the three-phase alternating currents are respectively supplied to the three-phase winding sets 100 and 101 from the inverter circuits 12 and 13. Accordingly, when the electric power steering apparatus 1 operates normally without having a short circuit or a ground fault, all of the phase current added values A1 and A2 become zero as shown in FIG. 3. Accordingly, the absolute value B of the total phase current added value also becomes zero. Since the phase current added values A1 and A2 are within the determination range (i.e., from Ad to Au); and the absolute value B of the total phase current added value is smaller than the determination threshold value Bth, the microcomputer 140 determines that neither a short circuit nor a ground fault occurs.

When a short circuit occurs between the part where the inverter circuit 12 and the three-phase winding set 100 are arranged and the part where the inverter circuit 13 and the three-phase winding set 101 are arranged at time t1, a current flows between the three-phase winding set 100 and the three-phase winding set 101. For example, when a short circuit occurs between the three-phase winding sets 100 and 101 and a current flows into the three-phase winding set 101 from the three-phase winding set 100, the phase current added value A1 is decreased whereas the phase current added value A2 is increased in the decreasing amount of the phase current added value A1 given that the current flowing into the three-phase winding set is assigned as a positive sign and the current flowing out from the three-phase winding set is assigned as a negative sign.

When the three-phase alternating currents respectively supplied to the three-phase winding sets 100 and 101 from the inverter circuits 12 and 13 increase over time the current flowing from the three-phase winding set 100 to the three-phase winding set 101 also increase. Accordingly, when the phase current added value A1 is further decreased, the phase current added value A2 is further increased in the decreasing amount of the phase current added value A1.

When the phase current added value A1 becomes smaller than the minimum value Ad of the determination range (i.e., from Ad to Au), the phase current added value A2 becomes larger than the maximum value of the determination range (i.e., from Ad to Au). However, when a ground fault does not occur, the absolute value B of the total phase current added value is still zero. Since the phase current added values A1 and A2 are out of the determination range (i.e., from Ad to Au); and the absolute value B of the total phase current added value is smaller than the determination threshold value Bth, the microcomputer 140 determines that only a short circuit occurs without having a ground fault. Then, the short circuit flag is in an on state, and the maximum current limiting value is configured to be smaller than the one at a previous time. As a result, the maximum current limiting value gradually becomes smaller when the short-circuit state continues.

When the three-phase currents are supplied to the three-phase winding sets 100 and 101 from the inverter circuits 12 and 13 in a ground state, the currents concentrate at a ground fault position and generate heat locally. However, it is not possible to generate heat locally when neither a short circuit nor a ground fault occurs. The microcomputer 140 continues to control the inverter circuits 12 and 13 such that the three-phase alternating currents respectively supplied to the three-phase winding sets 100 and 101 from the inverter circuits 12 and 13 do not exceed the maximum current limiting value. As a result, the magnitudes of the three-phase alternating currents supplied to the three-phase winding sets 100 and 101 from the inverter circuits 12 and 13 are restricted and gradually become smaller over time. Accordingly, the torque for assisting in steering the steering wheel is continued to be generated while inhibiting the abnormal state as much as possible.

The following describes the effect of the electric power steering apparatus according to the first embodiment.

The control circuit 14 controls the inverter circuits 12 and 13 such that the three-phase alternating currents are respectively supplied to the three-phase winding sets 100 and 101 from the inverter circuits 12 and 13. Accordingly, when a short circuit or a ground fault does not occur, all of the phase current added values A1 and A2 are zero. Accordingly, the absolute value B of the total phase current added value also becomes zero. However, when a short circuit occurs between the part where the inverter circuit 12 and the three-phase winding set 100 are arranged and the part where the inverter circuit 13 and the three-phase winding set 101 are arranged, a current flows between the three-phase winding set 100 and the three-phase winding set 101, and hence the phase current added values A1 and A2, which are zero when a short circuit does not occur, is increased or decreased. In addition, when at least one of the inverter circuits 12, 13 and the three-phase winding sets 100, 101 is grounded to the ground GND, a current flows between the three-phase winding set connected to the inverter circuit being grounded and the ground GND or between the three-phase winding set being grounded and the ground GND, and hence the absolute value B of the total phase current added value, which is zero when a ground fault does not occur, is increased.

According to the first embodiment, the control circuit 14 determines that a short circuit occurs when the phase current added values A1 and A2 is out of the determination range (i.e., from Ad to Au); and the absolute value B of the total phase current added value is smaller than the determination threshold value Bth. Accordingly, a short circuit can be surely detected in distinction from a ground fault.

When the three-phase alternating currents are supplied to the three-phase winding sets 100 and 101 from the inverter circuits 12 and 13 in a ground state, it is possible that the currents concentrate at a ground fault position and generate heat locally. However, when neither a short circuit nor a ground fault occurs, it is not possible to generate heat locally.

According to the first embodiment, the control circuit 14 can detect a short circuit in distinction from a ground fault. When it is determined that a short circuit occurs, the magnitudes of the three-phase alternating currents respectively supplied to the three-phase winding sets 100 and 101 are restricted. Accordingly, the torque for assisting in steering the steering wheel is continued to be generated while inhibiting the abnormal state as much as possible. Accordingly, it can be prevented from the situation in which the steering of the steering wheel suddenly becomes more difficult without having the auxiliary torque.

According to the first embodiment, the control circuit 14 controls the three-phase alternating currents respectively supplied to the three-phase winding sets 100 and 101 from the inverter circuits 12 and 13. When it is determined that a short circuit does not occur, the maximum current limiting value is configured to be smaller. Accordingly, when it is determined that a short circuit occurs, the magnitudes of the three-phase alternating currents supplied to the three-phase winding sets 100 and 101 from the inverter circuits 12 and 13 can be surely restricted.

According to the first embodiment, the motor 10 generates a torque assisting in steering the steering wheel of the vehicle. Accordingly, with regard to an electronic apparatus with the motor 10, that is, the electric power steering apparatus 1, a short circuit can be surely detected in distinction from a ground fault.

According to the first embodiment, the motor 10 includes two three-phase winding sets 100 and 101. Two inverter circuits 12 and 13 are provided for each of the three-phase winding sets, and the inverter circuits 12 and 13 are respectively connected to the three-phase winding sets 100 and 101. The control circuit 14 is connected to the inverter circuits 12 and 13, and controls the inverter circuits 12 and 13 such that three-phase alternating currents are respectively supplied to the three-phase winding sets 100 and 101 from the inverter circuits 12 and 13. Subsequently, it is determined that a short circuit occurs when i) the phase current added values A1 and A2 are out of the determination range (i.e., from Ad to Au); and ii) the absolute value B of the total phase current added value is smaller than the determination threshold value Bth. Accordingly, the electric power steering apparatus 1, which includes the three-phase winding sets 100 and 101 and the inverter circuits 12 and 13 respectively connected to the three-phase winding sets 100 and 101 as configuration elements, surely detects a short circuit in distinction from a ground fault.

It is noted that the first embodiment illustrates an example in that the motor 10 includes the three-phase winding sets 100 and 101; and the inverter circuits 12, 13 and the control circuit 14 are configured to be compatible with the motor 10. However, it is not restricted to this example shown in the first embodiment. The motor may have a multi-phase winding set other than a three-phase winding set. In addition, the motor may have three or more multi-phase winding sets. The inverter circuit and the control circuit may be configured to be compatible with the multi-phase winding set. When the control circuit determines that a short circuit occurs when i) a plurality of values among the phase current added value obtained by adding each of the phase currents flowing through each of the plurality of phase windings calculated at each of the multi-phase winding sets are out of the predetermined range; and ii) the absolute value of the total phase current added value obtained by summing up each the phase current added values calculated at each of the multi-phase winding sets is smaller than the predetermined value, the control circuit can also surely detect a short circuit in distinction from a ground fault.

It is noted that a flowchart or the processing of the flowchart in the present application includes sections (also referred to as steps), each of which is represented, for instance, as S100. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:
1. An electronic apparatus, comprising:
   a rotating electric machine that has a plurality of multi-phase winding sets, each of which having a plurality of phase windings;

a plurality of inverter circuits that are arranged for each of the plurality of multi-phase winding sets respectively, and are connected to the plurality of multi-phase winding sets respectively; and a control circuit that is connected to the plurality of inverter circuits, and controls the plurality of inverter circuits such that a multi-phase alternating current is supplied to each of the plurality of multi-phase winding sets from each of the plurality of inverter circuits, wherein the control circuit determines that a short circuit occurs when i) a plurality of phase current added values obtained by summing up each phase current flowing through each of the plurality of phase windings calculated at each of the plurality of multi-phase winding sets are out of a predetermined range; and ii) an absolute value of a total phase current added value obtained by summing up all of the plurality of phase current added values is smaller than a predetermined value.

2. The electronic apparatus according to claim 1, wherein the control circuit limits a magnitude of the multi-phase alternating current supplied to each of the plurality of multi-phase winding sets from each of the plurality of inverter circuits when the control circuit determines that the short circuit occurs.

3. The electronic apparatus according to claim 2, wherein the control circuit controls the multi-phase alternating current supplied to each of the plurality of multi-phase winding sets from each of the inverter circuits so as not to exceed a maximum current limiting value which is predetermined, and minimizes the maximum current limiting value when the control circuit determines that the short circuit occurs.

4. The electronic apparatus according to claim 1, wherein the rotating electric machine generates a torque for assisting in steering a steering wheel of a vehicle.

5. The electronic apparatus according to claim 1, wherein the rotating electric machine has two three-phase winding sets, each of which having three phase windings;

wherein two inverter circuits are provided to each of the two three-phase winding sets;

wherein the control circuit is connected to the two inverter circuits and controls the two inverter circuits such that a three-phase alternating current is provided to each of the two three-phase winding sets from each of the two inverter circuits, and determines that a short circuit occurs when i) two phase current added values obtained by adding a phase current flowing through each of the three phase windings calculated at each of the two three-phase winding sets are out of the predetermined range; and ii) an absolute value of the total phase current added values obtained by adding the two phase current added values is smaller than the predetermined value.

* * * * *